United States Patent
Lee

(10) Patent No.: US 7,368,309 B2
(45) Date of Patent: *May 6, 2008

(54) NITRIDE SEMICONDUCTOR AND FABRICATION METHOD THEREOF

(75) Inventor: Suk Hun Lee, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 66 days.

This patent is subject to a terminal disclaimer.

(21) Appl. No.: 10/516,742

(22) PCT Filed: Aug. 19, 2003

(86) PCT No.: PCT/KR03/01669

§ 371 (c)(1),
(2), (4) Date: Dec. 6, 2004

(87) PCT Pub. No.: WO2004/017432

PCT Pub. Date: Feb. 26, 2004

(65) Prior Publication Data

US 2005/0250233 A1    Nov. 10, 2005

(30) Foreign Application Priority Data

Aug. 19, 2002  (KR) .................. 10-2002-0049010

(51) Int. Cl.
    *H01L 21/00*       (2006.01)
(52) U.S. Cl. .................... 438/46; 438/22; 438/93; 257/79; 257/103; 257/E21.365; 257/E21.366
(58) Field of Classification Search .............. 438/35; 257/E21.053, E21.351, E21.352, E21.365, 257/E21.366
See application file for complete search history.

(56) References Cited

U.S. PATENT DOCUMENTS

| 6,172,382 | B1* | 1/2001 | Nagahama et al. | 257/94 |
| 6,459,100 | B1* | 10/2002 | Doverspike et al. | 257/97 |
| 6,657,234 | B1* | 12/2003 | Tanizawa | 257/79 |
| 7,193,236 | B2* | 3/2007 | Lee | 257/22 |
| 2001/0035531 | A1* | 11/2001 | Kano et al. | 257/96 |
| 2002/0125492 | A1* | 9/2002 | Shakuda | 257/94 |

FOREIGN PATENT DOCUMENTS

| JP | 7-302929 A2 | 11/1995 |
| JP | 9-199759 A2 | 7/1997 |
| JP | 9-293897 A2 | 11/1997 |
| JP | 10-173220 A2 | 6/1998 |
| JP | 11-238935 A | 8/1999 |
| JP | 2001-7397 A2 | 1/2001 |
| JP | 2001-274376 A | 10/2001 |

\* cited by examiner

*Primary Examiner*—Michael Lebentritt
*Assistant Examiner*—Cheung Lee
(74) *Attorney, Agent, or Firm*—Birch, Stewart, Kolasch & Birch, LLP

(57) ABSTRACT

The present invention relates to nitride semiconductor, and more particularly, to GaN-based nitride semiconductor and fabrication method thereof. The nitride semiconductor according to the present invention comprises a substrate; a GaN-based buffer layer formed in any one of a group of three-layered structure $Al_yIn_xGa_{1-(x+y)}N/In_xGa_{1-x}N/GaN$ where $0 \leq x \leq 1$ and $0 \leq y \leq 1$, two-layered structure $In_xGa_{1-x}N/GaN$ where $0 \leq x \leq 1$ and superlattice structure of $In_xGa_{1-x}N/GaN$ where $0 \leq x \leq 1$; and a GaN-based single crystalline layer.

18 Claims, 4 Drawing Sheets

[ FIG. 1 ]
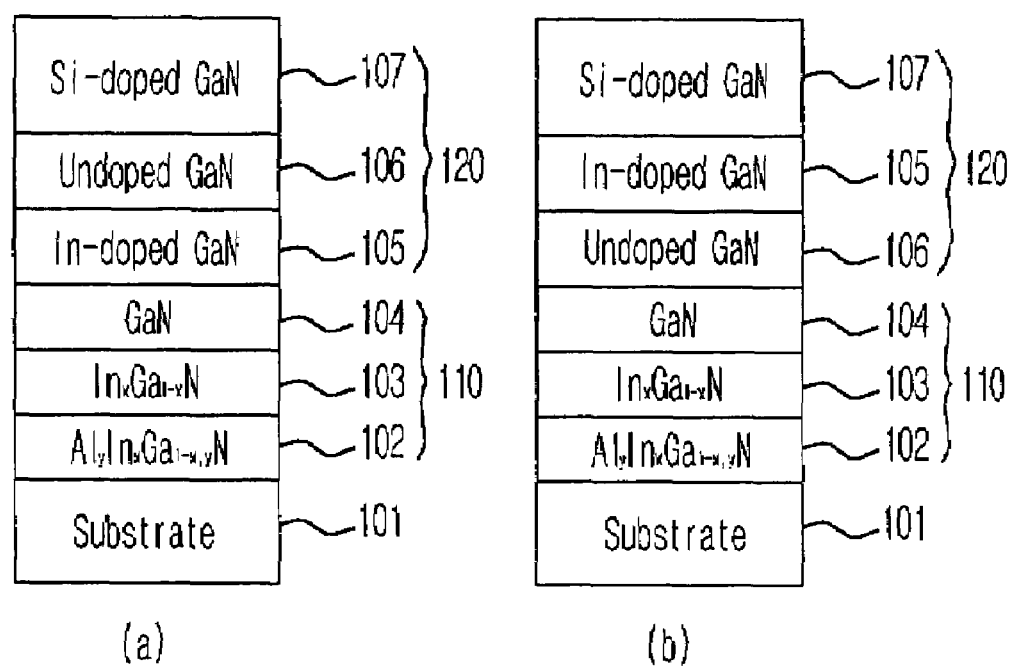

[ FIG. 2 ]
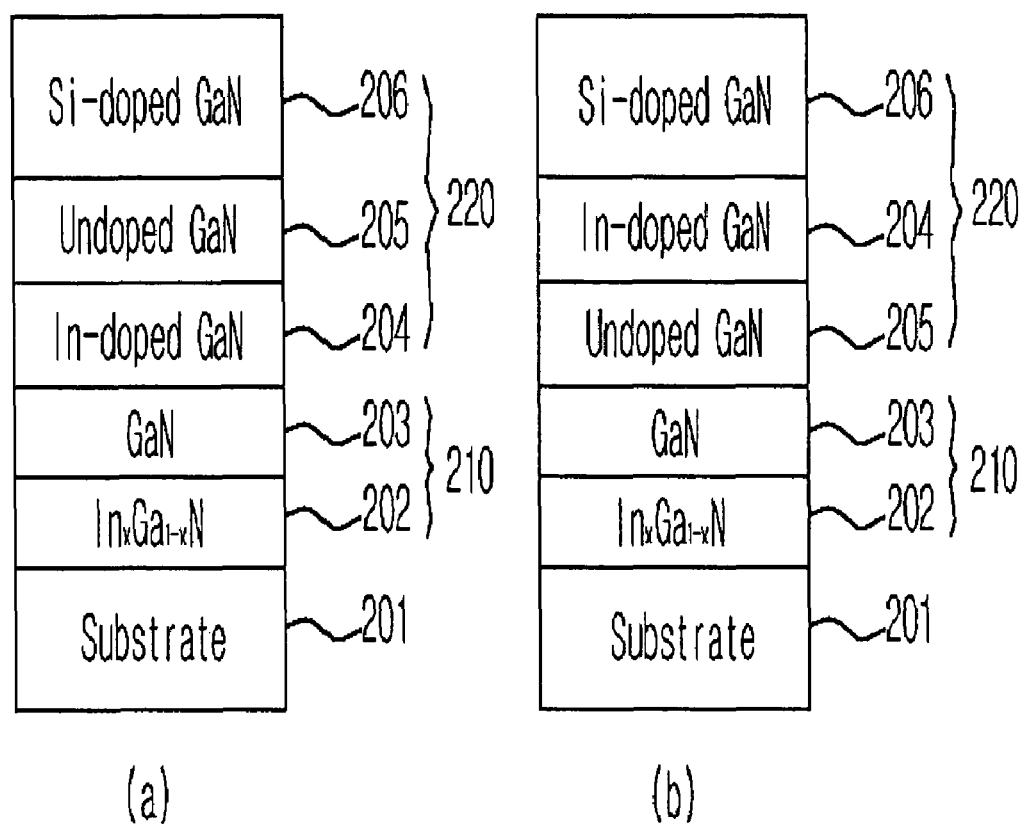

[ FIG. 3 ]
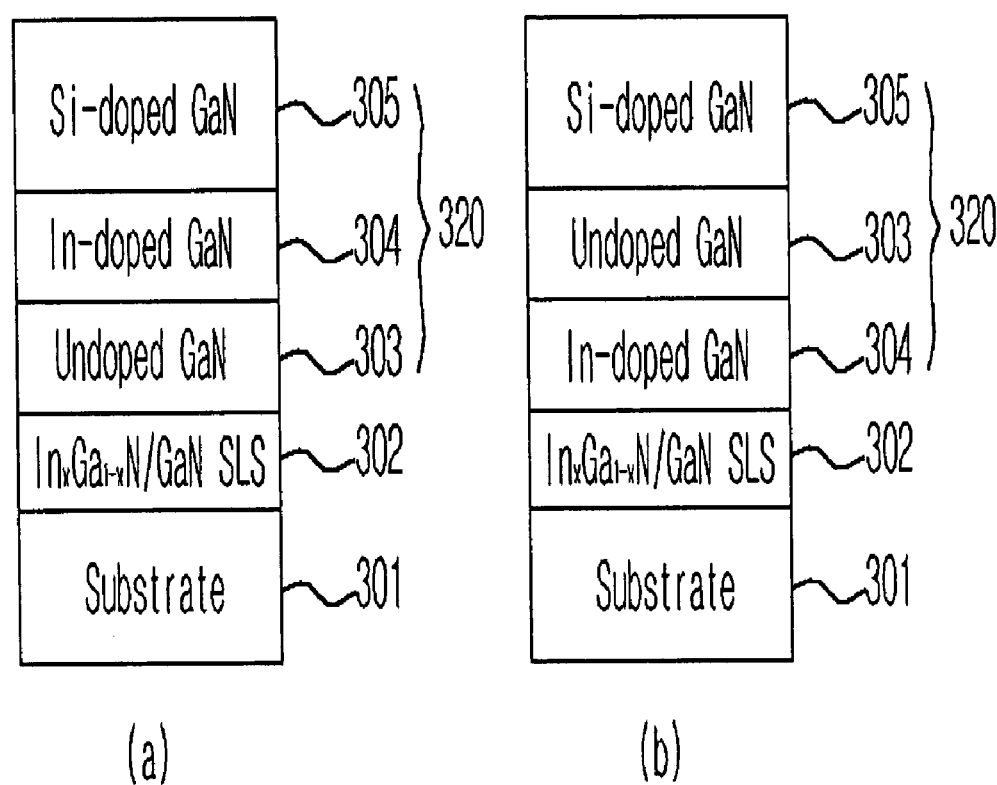

[ FIG. 4 ]
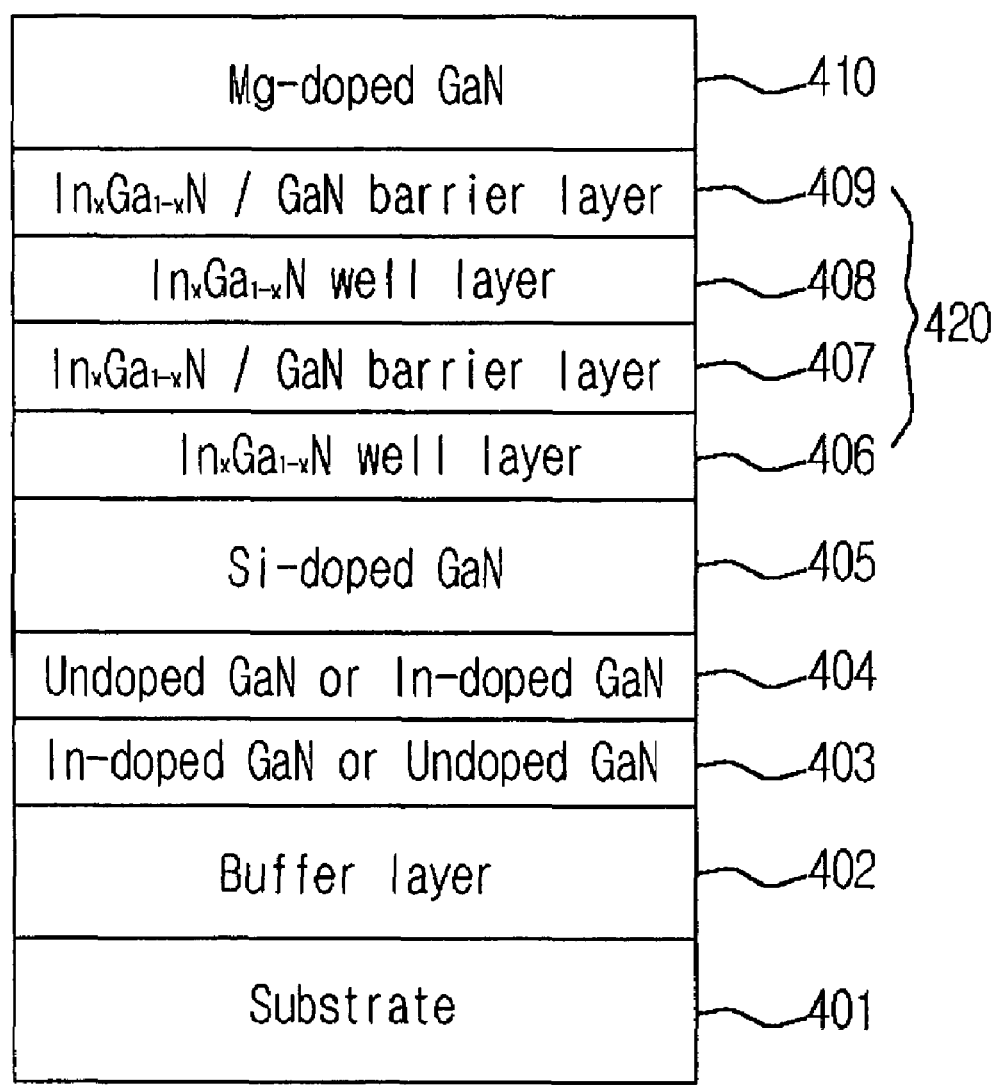

NITRIDE SEMICONDUCTOR AND FABRICATION METHOD THEREOF

TECHNICAL FIELD

The present invention relates to nitride semiconductor, and more particularly, to GaN-based nitride semiconductor and fabrication method thereof.

BACKGROUND ART

Generally, a GaN-based nitride semiconductor is applied to electronic devices that are high-speed switching and high power devices such as optic elements of blue/green LEDs, MESFET, HEMT, etc. In particular, the blue/green LED is under a state in which mass-production has been already progressed and a global sale is being exponentially increased.

Such a GaN-based nitride semiconductor is grown up usually on a sapphire or SiC substrate. At a low growth temperature, a polycrystalline layer of $Al_xGa_{1-x}N$ is grown as a buffer layer on a sapphire substrate or a SiC substrate. After that, at a high temperature, a good quality GaN-based single crystalline layer is grown on the buffer layer, thereby fabricating the GaN-based nitride semiconductor.

Meanwhile, to improve the performance of the GaN-based nitride semiconductor and assure the reliability thereof, an innovative buffer layer is researched and the GaN-based nitride semiconductor fabrication method has been studied very actively.

DISCLOSURE OF THE INVENTION

An object of the present invention is to provide a nitride semiconductor and fabrication method thereof that can reduce crystal defects caused by a differences between thermal expansion coefficients of a GaN-based single crystalline layer and a substrate and a difference between lattice constants of them and enhance the crystallinity of the GaN-based nitride semiconductor, to thereby improve the performance of the nitride semiconductor and assure reliability.

Another object of the present invention is to provide a nitride semiconductor light emitting device (LED) that can improve the performance thereof and assure the reliability.

To achieve these and other advantages and in accordance with the purpose of the present invention, as embodied and broadly described, a nitride semiconductor includes: a substrate; a GaN-based buffer layer formed on the substrate in any one selected from a group consisting of a three-layered structure $Al_yIn_xGa_{1-(x+y)}N/In_xGa_{1-x}N/GaN$ where $0 \leq x \leq 1$ and $0 \leq y \leq 1$, a two-layered structure $In_xGa_{1-x}N/GaN$ where $0 \leq x \leq 1$ and a superlattice structure of $In_xGa_{1-x}N/GaN$ where $0 \leq x \leq 1$; and a GaN-based single crystalline layer formed on the GaN-based buffer layer.

In an aspect of the present invention, there is provided a method for fabricating a nitride semiconductor. The method includes the steps of: (a) growing a GaN-based buffer layer on a substrate in any one selected from a group consisting of a three-layered structure $Al_yIn_xGa_{1-(x+y)}N/In_xGa_{1-x}N/GaN$ where $0 \leq x \leq 1$ and $0 \leq y \leq 1$, a two-layered structure $In_xGa_{1-x}N/GaN$ where $0 \leq x \leq 1$, and a superlattice structure of $In_xGa_{1-x}N/GaN$ where $0 \leq x \leq 1$; and (b) growing a GaN-based single crystalline layer on the grown GaN-based buffer layer.

In another aspect of the present invention, a nitride semiconductor light emitting device includes: a substrate; a GaN-based buffer layer formed on the substrate in any one selected from a group consisting of a three-layered structure $Al_yIn_xGa_{1-(x+y)}N/In_xGa_{1-x}N/GaN$ where $0 \leq x \leq 1$ and $0 \leq y \leq 1$, a two-layered structure $In_xGa_{1-x}N/GaN$ where $0 \leq x \leq 1$, and a superlattice structure of $In_xGa_{1-x}N/GaN$ where $0 \leq x \leq 1$; a first electrode layer of an n-GaN layer formed on the GaN-based buffer layer; an activation layer formed on the first electrode layer; and a second electrode layer of a p-GaN layer formed on the activation layer.

BRIEF DESCRIPTION OF THE DRAWINGS

FIGS. 1(a) and 1(b) are schematic diagrams illustrating the structure of a first embodiment of a nitride semiconductor formed by a nitride semiconductor fabrication method according to the present invention;

FIGS. 2(a) and 2(b) are schematic diagrams illustrating the structure of a second embodiment of a nitride semiconductor formed by a nitride semiconductor fabrication method according to the present invention;

FIGS. 3(a) and 3(b) are schematic diagrams illustrating the structure of a third embodiment of a nitride semiconductor formed by a nitride semiconductor fabrication method according to the present invention; and FIG. 4 is a cross-sectional view schematically illustrating the structure of a nitride semiconductor LED formed by a nitride semiconductor fabrication method according to the present invention.

BEST MODE FOR CARRYING OUT THE INVENTION

Reference will now be made in detail to the preferred embodiments of the present invention, examples of which are illustrated in the accompanying drawings.

FIGS. 1(a) and 1(b) are schematic diagrams illustrating the structure of a first embodiment of a nitride semiconductor formed by a nitride semiconductor fabrication method according to the present invention.

The nitride semiconductor according to the present invention, as shown in FIG. 1(a), includes a substrate (i.e. a sapphire substrate or a SiC substrate) 101 and a GaN-based buffer layer 110 formed on the substrate 101 in three-layered structure $Al_yIn_xGa_{1-(x+y)}N/In_xGa_{1-x}N/GaN$ 102-104 where $0 \leq x \leq 1$ and $0 \leq y \leq 1$. A GaN-based single crystalline layer 120 is formed on the GaN-based buffer layer 110. Here, the GaN-based single crystalline layer 120 includes an Indium-doped GaN layer 105, an undoped GaN layer 106, and a silicon-doped n-GaN layer 107.

As shown in FIGS. 1(a) and 1(b), in the GaN-based single crystalline layer 120, after the Indium-doped GaN layer 105 is formed, the undoped GaN layer 106 may be formed on the Indium-doped GaN layer 105. Otherwise, after the undoped GaN layer 106 is formed, the Indium-doped GaN layer 105 may be formed on the undoped GaN layer 106.

The GaN-based buffer layer 110 of the nitride semiconductor is grown in an MOCVD equipment at a temperature of 500-800° C. and in a thickness of 50-800 Å. The GaN-based buffer layer 110 is grown by while supplying carrier gases of $H_2$ and $N_2$, introducing sources of TMGa, TMIn and TMAl and gas of highly pure (>99.9995%) $NH_3$ at the same time. Here, the flow of the sources of TMGa, TMIn and TMAl is 5-300 μmol/min, and the growing pressure is 100-700 torr.

The GaN-based buffer layer 110 can efficiently cancel the stress caused due to the differences between thermal expansion coefficients of the substrate 101 and the GaN-based buffer layer 110 and between lattice constants of the substrate 101 and the GaN-based buffer layer 110 in conjunction of the $Al_yGa_{1-y}N$ layer 102 and $In_xGa_{1-x}N$ layer 103. Accordingly, it helps GaN seed grow and be combined when the GaN seed grows upwards from the GaN layer 104 positioned at the upper portion of the GaN-based buffer layer 110. The crystal defects such as dislocation generated at the boundary between the substrate 101 and the GaN-based buffer layer 110 is minimized so that good GaN-based nitride semiconductor can be obtained.

The GaN-based crystal layer 120 of the nitride semiconductor according to the present invention is grown at the temperature of 900-1100° C. by using the MOCVD equipment, and by supplying sources of TMGa and TMIn. The gas of $SiH_4$ is used as a doping source. Here, the electrode of the n-GaN layer 107 has carrier concentration of $1 \times 10^{18}/cm^3$ or more. When the sources of TMGa and TMIn is introduced, their pressure is 100-700 torr and their flow is 0.1-700 μmol/min.

Meanwhile, FIGS. 2(a) and 2(b) are schematic diagrams illustrating structure of a second embodiment of nitride semiconductor fabricated in a nitride semiconductor fabrication method according to the present invention.

The nitride semiconductor according to the present invention, as shown in FIG. 2(a), includes a substrate (i.e. a sapphire substrate or a SiC substrate) 201 and a GaN-based buffer layer 210 formed on the substrate 201 in two-layered structure $In_xGa_{1-x}N/GaN$ 202 and 203 where $0 \leq x \leq 1$. A GaN-based single crystalline layer 220 is formed on the GaN-based buffer layer 210. Here, the GaN-based single crystalline layer 220 includes an Indium-doped GaN layer 204, an undoped GaN layer 205, and a silicon-doped n-GaN layer 206.

The GaN-based buffer layer 210 helps GaN seed grow and be combined when the GaN seed grows upwards from the GaN layer 203 positioned at the upper portion of the GaN-based buffer layer 210. The crystal defects such as dislocation generated at the boundary between the substrate 201 and the GaN-based buffer layer 210 is minimized so that good GaN-based nitride semiconductor can be obtained.

As shown in FIGS. 2(a) and 2(b), in the GaN-based single crystalline layer 220 laminated and formed on the GaN-based buffer layer 210, after the Indium-doped GaN layer 204 is formed, the undoped GaN layer 205 may be formed on the Indium-doped GaN layer 204. Otherwise, after the undoped GaN layer 205 is formed, the Indium-doped GaN layer 204 may be formed on the undoped GaN layer 205.

Since the nitride semiconductor having the above-mentioned structure is grown in the process similar to the fabrication method of the nitride semiconductor described in the first embodiment, the description of the fabrication method will be omitted.

Meanwhile, FIGS. 3(a) and 3(b) are schematic diagrams illustrating structure of a third embodiment of nitride semiconductor fabricated in a nitride semiconductor fabrication method according to the present invention.

The nitride semiconductor according to the present invention, as shown in FIG. 3(a), includes a substrate (i.e. a sapphire substrate or a SiC substrate) 301 and a GaN-based buffer layer formed on the substrate 301 in superlattice structure of $In_xGa_{1-x}N/GaN$ layer 302 where $0 \leq x \leq 1$. A GaN-based single crystalline layer 320 is formed on the $In_xGa_{1-x}N/GaN$ layer 302 that is the GaN-based buffer layer. Here, the GaN-based single crystalline layer 320 includes an undoped GaN layer 303, an Indium-doped GaN layer 304, and a silicon-doped n-GaN layer 306.

The $In_xGa_{1-x}N/GaN$ layer 302 is grown with thickness less than 30 Å alternatively so that the GaN-based buffer layer having the superlattice structure is formed. The boundary defects caused by the differences between the thermal expansion coefficients of the GaN-based buffer layer and the substrate 301 and between the lattice constants of them are minimized so that good GaN-based nitride semiconductor can be obtained.

As shown in FIGS. 3(a) and 3(b), in the GaN-based single crystalline layer 320 laminated and formed on the $In_xGa_{1-x}N/GaN$ layer 302 that is the GaN-based buffer layer, after the Indium-doped GaN layer 304 is formed, the undoped GaN layer 303 may be formed on the Indium-doped GaN layer 304. Otherwise, after the undoped GaN layer 303 is formed, the Indium-doped GaN layer 304 may be formed on the undoped GaN layer 303.

Since the nitride semiconductor having the above-mentioned structure is grown in the process similar to the fabrication method of the nitride semiconductor described in the first embodiment, the description of the fabrication method will be omitted.

Meanwhile, FIG. 4 is a cross-sectional view illustrating structure of a nitride semiconductor light emitting device fabricated in a nitride semiconductor fabrication method according to the present invention schematically.

The nitride semiconductor light emitting device according to the present invention includes a substrate 401, a GaN-based buffer layer 402 formed on the substrate 401, a first electrode layer of an n-GaN layer 405 formed on the GaN-based buffer layer 402; an activation layer 420 formed on the first electrode layer; and a second electrode layer of a p-GaN layer 410 formed on the activation layer 420.

Here, the GaN-based buffer layer 402 is formed in any one selected from a group consisting of a three-layered structure $Al_yIn_xGa_{1-(x+y)}N/In_xGa_{1-x}N/GaN$ where $0 \leq x \leq 1$ and $0 \leq y \leq 1$, a two-layered structure $In_xGa_{1-x}N/GaN$ where $0 \leq x \leq 1$, and a superlattice structure of $In_xGa_{1-x}N/GaN$ where $0 \leq x \leq 1$.

In other words, the nitride semiconductor light emission element according to the present invention is formed by growing a GaN-based nitride semiconductor as the GaN-based buffer layer 402 on a substrate (i.e. a sapphire substrate or a SiC substrate) 401, forming a silicon-doped n-GaN layer 405 as the first electrode layer, and forming a Mg-doped p-GaN layer 410 as the second electrode layer. The activation layer 420 of InGaN/GaN multiple quantum well structure is formed in a sandwich couple structure between the first electrode layer of the n-GaN layer 405 and the second electrode layer of the p-GaN layer 410.

Here, the activation layer 420 can consist of an $In_xGa_{1-x}N$ well layer 406, an $In_xGa_{1-x}N/GaN$ barrier layer 407, an $In_xGa_{1-x}N$ well layer 408 and an $In_xGa_{1-x}N/GaN$ barrier layer 409. The undoped GaN layer 403 or the Indium-doped GaN layer 404 may be formed between the GaN-based buffer layer 402 and the first electrode layer of the n-GaN layer 405.

INDUSTRIAL APPLICABILITY

As described above, the nitride semiconductor and fabrication method thereof according to the present invention can reduce the crystal defects caused by a differences between thermal expansion coefficients of a GaN-based single crystalline layer and a substrate and a difference between lattice constants of them and enhance the crystallinity of the GaN-based nitride semiconductor, to thereby improve the performance of the nitride semiconductor and assure reliability.

The invention claimed is:

1. A nitride semiconductor comprising:
   a substrate;
   a GaN-based buffer layer formed on the substrate, wherein said GaN-based buffer layer is a three-layered structure $Al_yIn_xGa_{1-(x+y)}N/In_xGa_{1-x}N/GaN$, where $0<x\leq1$ and $0\leq y\leq1$; and
   a GaN-based single crystalline layer formed on the GaN-based buffer layer.

2. The nitride semiconductor of claim 1, wherein the GaN-based single crystalline layer comprises:
   an indium-doped GaN layer;
   an undoped GaN layer formed on the Indium-doped GaN layer; and
   a silicon-doped n-GaN layer formed on the undoped GaN layer.

3. The nitride semiconductor of claim 1, wherein the GaN-based single crystalline layer comprises:
   an undoped GaN layer;
   an indium-doped GaN layer formed on the undoped GaN layer; and
   a silicon-doped n-GaN layer fanned on the indium-doped GaN layer.

4. A nitride semiconductor light emitting device comprising:
   a substrate;
   a GaN-based buffer layer formed on the substrate, wherein said GaN-based buffer layer is a three-layered structure $Al_yIn_xGa_{1-(x+y)}N/In_xGa_{1-x}N/GaN$ where $0<x\leq1$ and $0\leq y\leq1$; and
   a first electrode layer of an n-GaN layer formed on the GaN-based buffer layer;
   an activation layer formed on the first electrode layer; and
   a second electrode layer of a p-GaN layer formed on the activation layer.

5. The nitride semiconductor light emitting device of claim 4, further comprising:
   an Indium-doped GaN layer formed on the GaN-based buffer layer; and
   an undoped GaN layer formed on the Indium-doped GaN layer.

6. The nitride semiconductor light emitting device of claim 4, further comprising:
   an undoped GaN layer formed on the GaN-based buffer layer; and
   an Indium-doped GaN layer formed on the undoped GaN layer.

7. A method for fabricating a nitride semiconductor, the method comprising the steps of:
   (a) growing a GaN-based buffer layer on a substrate, wherein said GaN-based buffer layer is a three-layered structure $Al_yIn_xGa_{1-(x+y)}N/In_xGa_{1-x}N/GaN$, where $0<x\leq1$ and $0\leq y\leq1$; and
   (b) growing a GaN-based single crystalline layer on the grown GaN-based buffer layer.

8. The method of claim 7, wherein the step (b) comprises the steps of:
   growing an Indium-doped GaN layer;
   growing an undoped GaN layer on the Indium-doped GaN layer; and
   growing a silicon-doped n-GaN layer on the undoped GaN layer.

9. The method of claim 7, wherein the step (b) comprises the steps of:
   growing an undoped GaN layer;
   growing an Indium-doped GaN layer on the undoped GaN layer; and
   growing a silicon-doped n-GaN layer on the indium-doped GaN layer.

10. A method for fabricating a nitride semiconductor, the method comprising the steps of:
    (a) growing a GaN-based buffer layer on a substrate in any one selected from a group consisting of a three-layered structure $Al_yIn_xGa_{1-(x+y)}N/In_xGa_{1-x}N/GaN$ where $0<x\leq1$ and $0\leq y\leq1$, a two-layered structure $In_xGa_{1-x}N/GaN$ where $0<x\leq1$, and a superlattice structure of $In_xGa_{1-x}N/GaN$ where $0<x\leq1$; and
    (b) growing a GaN-based single crystalline layer on the grown GaN-based buffer layer,
    wherein the GaN-based buffer layer is grown in an MOCVD equipment at a temperature of 500-800° C. and in a thickness of 50-800 Å by introducing sources of TMGa, TMIn and TMAl and a gas of $NH_3$ at the same time while supplying carrier gases of $H_2$ and $N_2$.

11. The method of claim 10, wherein the GaN-based buffer layer is grown under a condition that flow of the sources of TMGa, TMIn and TMAl is 5-300 µmol/min and growing pressure is 100-700 torr.

12. A nitride semiconductor comprising:
    a substrate;
    a GaN-based buffer layer formed on the substrate in any one selected from a group consisting of a three-layered structure $Al_yIn_xGa_{1-(x+y)}N/In_xGa_{1-x}N/GaN$ where $0<x\leq1$ and $0\leq y\leq1$, a two-layered structure $In_xGa_{1-x}N/GaN$ where $0<x\leq1$, and a superlattice structure of $In_xGa_{1-x}N/GaN$ where $0<x\leq1$; and
    a GaN-based single crystalline layer formed on the GaN-based buffer layer,
    wherein the GaN-based buffer layer is grown in an MOCVD equipment at a temperature of 500-800° C. and in a thickness of 50-800 Å by introducing sources of TMGa, TMIn and TMAl and a gas of $NH_3$ at the same time while supplying carrier gases of $H_2$ and $N_2$.

13. The nitride semiconductor of claim 12, wherein the GaN-based buffer layer is grown under a condition that flow of the sources of TMGa, TMIn and TMAl is 5-300 µmol/min and growing pressure is 100-700 torr.

14. A nitride semiconductor light emitting device comprising:
    a substrate;
    a GaN-based buffer layer formed on the substrate in any one selected from a group consisting of a three-layered structure $Al_yIn_xGa_{1-(x+y)}N/In_xGa_{1-x}N/GaN$ where $0<x\leq1$ and $0\leq y\leq1$, a two-layered structure $In_xGa_{1-x}N/GaN$ where $0<x\leq1$, and a superlattice structure of $In_xGa_{1-x}N/GaN$ where $0<x\leq1$;
    a first electrode layer of an n-GaN layer formed on the GaN-based buffer layer;
    an activation layer formed on the first electrode layer; and
    a second electrode layer of a p-GaN layer formed on the activation layer,
    wherein the GaN-based buffer layer is grown in an MOCVD equipment at a temperature of 500-800° C. and in a thickness of 50-800 Å by introducing sources of TMGa, TMIn and TMAl and a gas of $NH_3$ at the same time while supplying carrier gases of $H_2$ and $N_2$.

15. The nitride semiconductor light emitting device of claim 14, wherein the GaN-based buffer layer is grown under a condition that flow of the sources of TMGa, TMIn and TMAl is 5-300 µmol/min and growing pressure is 100-700 torr.

16. A nitride semiconductor comprising:

a substrate;

a GaN-based buffer layer formed on the substrate, wherein said GaN-based buffer layer is a three-layered structure $Al_yIn_xGa_{1-(x+y)}N/In_xGa_{1-x}N/GaN$ where $0<x\leq1$ and $0\leq y\leq1$; and a GaN-based single crystalline layer formed on the GaN-based buffer layer, wherein the GaN-based buffer layer has a thickness of 50-800 Å.

17. A nitride semiconductor light emitting device comprising:

a substrate;

a GaN-based buffer layer formed on the substrate, wherein said GaN-based buffer layer is a three-layered structure $Al_yIn_xGa_{1-(x+y)}N/In_xGa_{1-x}N/GaN$, where $0<x\leq1$ and $0\leq y\leq1$;

a first electrode layer of an n-GaN layer formed on the GaN-based buffer layer;

an activation layer formed on the first electrode layer; and a second electrode layer of a p-GaN layer formed on the activation layer, wherein the GaN-based buffer layer has a thickness of 50-800 Å.

18. A method for fabricating a nitride semiconductor, the method comprising the steps of:

(a) growing a GaN-based buffer layer on a substrate, wherein said GaN-based buffer layer is a three-layered structure $Al_yIn_xGa_{1-(x+y)}N/In_xGa_{1-x}N/GaN$, where $0<x\leq1$ and $0\leq y\leq1$; and (b) growing a GaN-based single crystalline layer on the grown GaN-based buffer layer, wherein the GaN-based buffer layer has a thickness of 50-800 Å.

* * * * *